United States Patent
Hocke et al.

(10) Patent No.: US 7,054,714 B2
(45) Date of Patent: May 30, 2006

(54) INSTALLATION FOR PROCESSING A SEMICONDUCTOR WAFER AND METHOD FOR OPERATING THE INSTALLATION

(75) Inventors: Christoph Hocke, Dresden (DE); Michael Lering, Bubenreuth (DE); Gregor Kübart, Dresden (DE)

(73) Assignee: Infineon Technologies AG, Munich (DE)

( * ) Notice: Subject to any disclaimer, the term of this patent is extended or adjusted under 35 U.S.C. 154(b) by 238 days.

(21) Appl. No.: 10/401,185

(22) Filed: Mar. 27, 2003

(65) Prior Publication Data

US 2003/0187537 A1    Oct. 2, 2003

(30) Foreign Application Priority Data

Mar. 27, 2002    (DE) ................. 102 13 885

(51) Int. Cl.
*G06F 7/00*    (2006.01)
(52) U.S. Cl. ..................................... 700/225
(58) Field of Classification Search ........... 700/225, 700/213, 214; 414/940, 935
See application file for complete search history.

(56) References Cited

U.S. PATENT DOCUMENTS

| | | | | |
|---|---|---|---|---|
| 5,570,990 A | * | 11/1996 | Bonora et al. | 414/543 |
| 6,019,563 A | * | 2/2000 | Murata et al. | 414/222.01 |
| 6,050,768 A | * | 4/2000 | Iwasaki et al. | 414/222.01 |
| 6,098,809 A | * | 8/2000 | Okada et al. | 206/711 |
| 6,412,697 B1 | * | 7/2002 | Bridgelall et al. | 235/462.45 |
| 6,504,144 B1 | * | 1/2003 | Murata | 250/224 |

* cited by examiner

*Primary Examiner*—Khoi H. Tran

(74) *Attorney, Agent, or Firm*—Laurence A. Greenberg; Werner H. Stemer; Ralph E. Locher

(57) ABSTRACT

An installation for processing a semiconductor wafer includes a semiconductor fabrication device having a load port, on which an identity code that can be read optically or through an effective electromagnetic field is stored. A mobile device, for example, a container communicating with the load port or a vehicle for transporting such a container, contains a corresponding reader to determine the identifier. The configuration makes the flexible determination of position within a fabrication facility possible. Also provided is a method for operating the installation.

15 Claims, 3 Drawing Sheets

INSTALLATION FOR PROCESSING A SEMICONDUCTOR WAFER AND METHOD FOR OPERATING THE INSTALLATION

BACKGROUND OF THE INVENTION

Field of the Invention

The invention relates to an installation for processing a semiconductor wafer including a device for processing the semiconductor wafer, which has a loading device for supplying the semiconductor wafer and interface elements formed in the loading device. In addition, the invention relates to a method of operating such an installation, in particular, of carrying out a contamination measurement.

To produce semiconductor products, such as flat-screen monitors or integrated circuits, semi-conductor wafers are subjected to a large number of processing steps, such as layer deposition, structuring, etching, tempering, etc. Processing proceeds in various process devices within a semiconductor fabrication plant. To avoid contamination of the semiconductor product, the fabrication is carried out in clean rooms, which are as free as possible of particles and aggressive gases.

In industrial fabrication installations for the production of semiconductor products, the semiconductor wafers are transported in standardized containers that contain a large number of, for example, 25 wafers. The containers for semiconductor wafers of 300 mm diameter are designated front opening unified pod (FOUP). The FOUPs are transported manually by operating personnel or on vehicles moved on the floor, which are controlled automatically or by operating personnel, or by an automated transport system based on a conveyor belt or based on rails disposed in the overhead region (OHT: overhead transport). An OHT system operates virtually completely automatically and is operated by a central control device. In all the transport and processing operations, there is the intention to aim for the highest possible automation to reduce any susceptibility to faults. Among other things, the highest possible level of automation is also to apply during the manual operation of process devices or transport tasks.

The process devices set up in a fabrication facility in each case normally also have a plurality of loading devices, what are referred to as load ports. Within a semiconductor fabrication plant for the production of integrated circuits, there can be several hundred load ports. There is, therefore, the need to operate the detection of load ports in a manner that is automated as far as possible to rule out confusion. Hitherto, various possible ways of identifying a load port have been applied.

A load port is generally provided with a serial number from a manufacturer, for example, in the form of a marking applied laterally to the fabrication device or to the load port and having alphanumeric symbols. The form of the marking and the point at which it is applied are not standardized. Thus, automatic detection of the identification is virtually impossible.

The electronic control of a fabrication device is generally carried out with the assistance of a computer so that the control software has an electronic form of the identification of the load port. However, controllers for various devices are generally incompatible with one another.

Within the context of its central control, the overhead transport system has an identification stored electronically for each load port. However, at present, such identification is present centrally only for the OHT system and cannot readily be transferred to other components outside the system but within the fabrication facility, nor is it accessible to the operating personnel. There is, therefore, a lack of any possibility for a continuous, simply detectable identification for the large number of load ports within a fabrication facility for semiconductor products.

German Published, Non-Prosecuted Patent Application DE 198 16 151 A1, corresponding to U.S. Pat. Nos. 6,169,935, 6,151,533, 6,129,496, and 6,050,768 to Iwasaki et al., describes a fabrication installation for semiconductor wafers in which an automated transport system for the semiconductor wafer containers is used. A robot takes care of the transport of the semiconductor wafers between the load ports. A communication device fitted to the load port transmits the state of loading of the load port to the robot.

SUMMARY OF THE INVENTION

It is accordingly an object of the invention to provide an installation for processing a semiconductor wafer and method of operating such an installation that overcome the hereinafore-mentioned disadvantages of the heretofore-known devices and methods of this general type and that provides an easily readable, standardizable possible way of identifying the loading devices of fabrication devices in a fabrication facility for semiconductor products, and provides a method for the application, automated as far as possible, of the identification according to the invention of the loading devices within the fabrication facility for semiconductor products.

With the foregoing and other objects in view, there is provided, in accordance with the invention, a installation for processing a semiconductor wafer, including a device for processing the semiconductor wafer, the device having at least one loading device for supplying the semiconductor wafer, the loading device having interface elements for coupling to a container adapted to transport the semiconductor wafer and an identification device storing an identity code representing the loading device and being fitted to the loading device, and a mobile unit interacting with the identification device, the mobile unit registering the identity code and digitally storing and making available the identity code for further use.

According to the invention, the loading device of a fabrication device or its load port is provided with an identification device whose stored identifier can be detected by a mobile unit and can be provided digitally. The individual identification of each load port in a fabrication facility can, as a result, be registered directly and immediately and used for the further control of fabrication, measuring or transport tasks in the respective mobile unit. Possible mobile units are the containers for transporting semiconductor wafers, or transport devices that, with regard to the identification of the load ports, can, now, be oriented within the fabrication facility independently of their own central system control.

Finally, it is also possible for the operating personnel, by a mobile detection device, to detect the identifier and, therefore, to log manual activity steps automatically. After the end of work, the mobile device can be read in a reading station to store the log together with the load ports operated in the central control system of the fabrication facility. As compared with the conventional way in which the operating personnel work, it was previously necessary, for example, for the identifier of a load port, known in another way or determined, either to be detected and stored in handwritten form or registered by a separate manual entry.

In principle, each mobile device within the factory can be equipped with a reader for detecting the identification according to the invention for a load port, in order, in response to a triggering event, to register and store the instantaneous location with respect to the next load port.

In accordance with another feature of the invention, the identification device is applied to the loading device as an optically machine-readable marking or by a marking read through an electromagnetic field.

The identification of the load port is carried out with conventional identification measures known from other fields. For example, a bar code applied to the load port is suitable and is detected by an optical reader and evaluated to provide the identifier stored by the bar code digitally. An electronic identification is also conceivable, which can be activated and interrogated through an effective electromagnetic field. In an RF tag, as it is referred, comparable with a smart card, additional time-variant information can be kept stored and capable of interrogation in an electronic way, for example, installed software update, last maintenance, error code, etc. Both bar code and RF tag can readily be fixed at various points of the load port, preferably, by adhesive bonding. Readers of both types are readily available as standard devices and can, therefore, be integrated without difficulty in the mobile unit within the fabrication facility to link them to the electronics of the latter.

The identification measures used, for example, a bar-code sticker or RF-tag sticker, contains an identity code that is used to identify the identity of the load port. The identity code is invariant, does not change and is kept constant, to always identify the relevant load port within the fabrication installation unambiguously. In particular, the digital identity code in the identification device is stored constantly, regardless of the operating state of the device. The identification device behaves as a slave, while the reader serves as a master during a read operation. The reader controls the read operation, as master. The reader interacts with the identification device and, from this communication procedure, takes the identity code stored in the identification device.

The optical or high-frequency-compatible reader can be fixed to a transport device moved on the floor of the fabrication facility, normally on rollers, for example, for semiconductor containers or for measuring instruments. Such vehicles are referred to as an automatic guided vehicle (AGV), a personal guided vehicle (PGV), or a rail-guided vehicle (RGV). If the device transfers an FOUP to the load port or carries out a measurement in the vicinity of a load port, the identifier of the load port is registered and, if appropriate, together with the activity carried out or the measured values determined, is stored locally. The transmission to a central database can, then, be carried out immediately by a radio transmission or later by a link with a stationary station.

In accordance with a further feature of the invention, the transport device is a rail-guided transport system having rails and vehicles guided by the rails for transporting the container and the reader is fixed to at least one of the vehicles.

In another application, the vehicle traveling on the rail system of an overhead transport system is equipped with a reader and, as such, registers its instantaneous position. The registration is carried out, in particular, when an FOUP is transferred to a loading device of a fabrication device. In addition to a device that treats or investigates the surface of a semiconductor wafer, a storage device for FOUPs or semiconductor wafers is also viewed as a fabrication device. The position registered can be used as a reference for the location of the OHT vehicle or can be compared with the location information, which is known in another way from the OHT system control.

In accordance with an added feature of the invention, there are provided a further container removably coupled to the loading device through the interface elements, the further container having a signal processing device producing an output value and a reader fixed at the further container, the reader assigning the output value the identity code digitally provided by the loading device.

In accordance with an additional feature of the invention, the identification device is applied to a section of the loading device disposed opposite one side of the container placed on the loading device.

In accordance with yet another feature of the invention, the interface elements have a carrier plate receiving thereon a container communicating with the loading device and the identification device is fixed to the carrier plate.

In accordance with yet a further feature of the invention, the identification device is an optical identification device and the container has an image recording device recording the identity code from the loading device on which the container is placed.

In accordance with yet an added feature of the invention, the image recording device has an optical sensor disposed within the container, the interface elements have a carrier plate receiving thereon the container communicating with the loading device, and the optical sensor lies immediately opposite the identification device when the container is placed on the carrier plate.

In accordance with yet an additional feature of the invention, the container has a baseplate with a hole accommodating the optical sensor and an image evaluation device determining the identity code from an optically received signal.

In accordance with again another feature of the invention, the container has a measuring device for measuring contamination of the air and the reader determines the identity code associated with a contamination measuring operation and associated with a contamination value and stores the identity code temporarily in the signal processing device.

One particular application of the identification of load ports according to the invention lies in determining the location of a measuring FOUP, as it is known. A measuring FOUP is a container that is comparable with an FOUP that transports semiconductor wafers and that has the standardized features of such a production wafer FOUP. As a result, in terms of its interfaces, the measuring FOUP is compatible with the production FOUP. One exemplary embodiment of a measuring FOUP is described in German Published, Non-Prosecuted Patent Application number 101 33 520.2-52 entitled "System and method for measuring characteristics of the ambient air in a clean room and process". According to that application, the FOUP therein includes an inlet valve for absorbing ambient air from the clean room. An outlet valve releases inner air from the FOUP into the clean room. The clean room, itself, is governed by a laminar air flow directed from top to bottom, if possible. The FOUP is transported through the clean room in the same manner as a common FOUP provided with semiconductor wafers and constantly absorbs ambient air through one valve and emits corresponding inner air through an outlet valve into the clean room. A measuring instrument measuring one or several characteristic parameters of the air in the FOUP is disposed on the inside of a housing, the measured parameters including, but not limited to, for example, the air temperature, the contamination by particles, the contamination by gases, or the steam moisture.

The measuring FOUP according to the present invention contains a measuring instrument in order, for example, to measure the contamination of air taken up at various points. In a particularly advantageous use, the measuring FOUP is placed on a load port of a fabrication device and picks up the ambient air contained in the interior of the fabrication device, the mini environment, as it is known, or moves a measuring probe into the region of the mini environment. By the contamination measurement, for example, particle contamination, electrostatic charge or discharge, gas contamination, and other contamination events are measured. The measuring FOUP can be controlled automatically through the fabrication facility during an operating pause or during the night and can move to different load ports to carry out the aforementioned contamination measurements in the external environment of the load port and in the mini environment accessible through the load port. The measured values determined are additionally assigned the recorded identifier of the load port at which the measurement was carried out, and this identifier is subsequently stored. After the measuring cycle has been processed, for example, at the start of operations in the morning, the electronics of the measuring FOUP are connected to a stationary station to read in the measured values provided with the load port identifier, to evaluate them, and to archive them. Of course, in the event of manual transport of the measuring FOUP to a selected load port by an operator, the identification of the load port can, subsequently, also be registered by pressing a pushbutton. The use described is largely automated or, in the event of manual operation, confusion regarding the measuring location is ruled out.

With regard to the application of the identification device to provide the load port identifier, the identification device can be applied at any desired point of the load port, provided that the desired accuracy of association with the load port is achieved. When the reader in the measuring FOUP is used, it is particularly suitable for the identification to be applied to the carrier plate that carries the measuring FOUP, if the latter communicates with the interface devices of the load port. If use is made of a bar code stuck to the carrier plate of the load port, or of another code that can be detected optically, an image recording device, for example, a CCD camera, is provided in the measuring FOUP and is positioned directly opposite the bar code. The CCD camera records the image and, by using suitable image processing algorithms that are known per se, an evaluation device connected downstream determines the digital code.

With the objects of the invention in view, there is also provided a method of operating an installation for processing a semiconductor wafer, including the steps of providing a semiconductor wafer-processing device having at least one loading device supplying the semiconductor wafer to the processing device, coupling a semiconductor wafer transporting container containing a measuring device to interface elements of the at least one loading device, registering an identification applied to the at least one loading device by interacting a reader of a mobile unit with the identification and determining an identity code representing the at least one loading device, operating the measuring device and determining a digital measured value, and assigning, with the mobile unit the measured value to the identity code determined and storing the measured value and the identifier, associated with each other, in a temporary memory contained in the container.

With the objects of the invention in view, there is also provided a method of operating an installation, including the steps of coupling a container containing a measuring device to an interface of a loading device of a semiconductor wafer-processing device, registering an identification applied to the loading device by interacting a reader with the identification and determining an identity code representing the loading device, operating the measuring device and determining a digital measured value, and assigning the digital measured value to the identity code determined and storing the digital measured value and the identity code associated with each other in a temporary memory contained in the container.

In accordance with a concomitant mode of the invention, there are provided the steps of opening a door of the processing device and measuring a parameter of the air contained in the processing device and storing the measured value in association with the identity code determined.

Other features that are considered as characteristic for the invention are set forth in the appended claims.

Although the invention is illustrated and described herein as embodied in an installation for processing a semiconductor wafer and method of operating such an installation, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
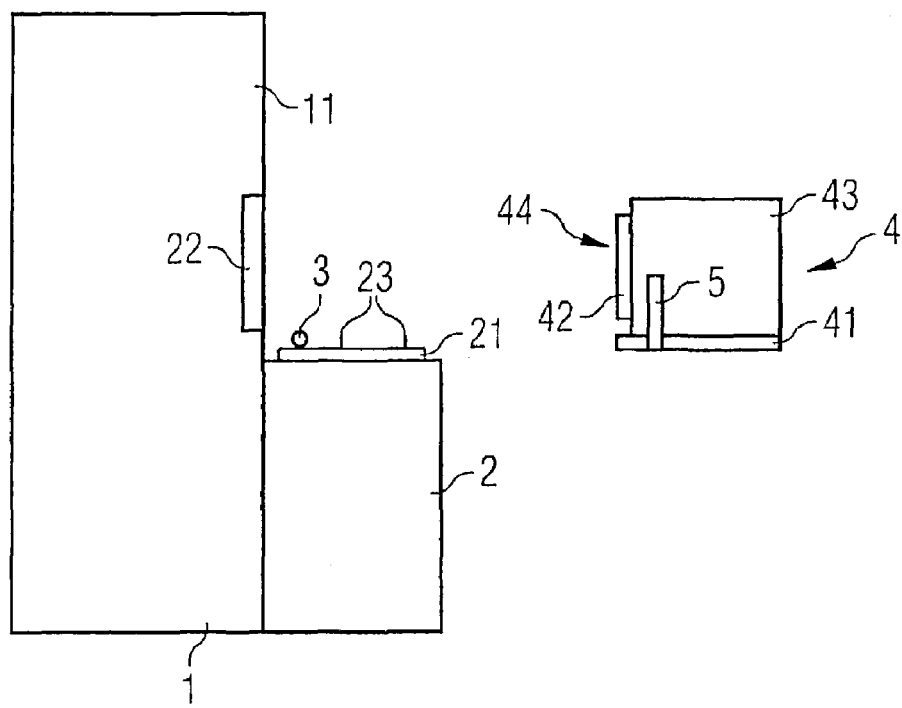
FIG. 1 is an elevational view of a semiconductor fabrication device according to the invention with a load port and a container that is to be placed on the load port.

Referring now to the figures of the drawings in detail and first, particularly to FIG. 1 thereof, there is shown a side view of a fabrication device 1, which can be any processing device required within a fabrication facility for the processing of semiconductor wafers, for example, a deposition chamber, a dry etching chamber, a wet etching installation, a sorting device, a storage device, etc. The semiconductor wafers are transported in containers, the FOUPs. The FOUPs are standardized, in particular with regard to their interfaces, to be able to communicate with the loading device 2 or the load port 2. The load port 2 is placed on the fabrication device 1. The load port 2 has a carrier plate 21, onto which the FOUP is placed.

The interface elements of the load port also include, in addition to the carrier plate 21, a door 22 that is largely standardized in terms of its dimensions. The door 22 closes the hermetically shielded inner environment of the fabrication device 1. In the mini environment 11 within the fabrication device 1, there may prevail a clean room environment that is better by several classes than outside the device. Adjusting pins 23 ensure exact alignment of the FOUP.

The FOUP 4 includes a housing 43, preferably, produced from plastic, to which gripping elements are fitted for manual and/or automated transport. The FOUP 4 has a baseplate 41, which is formed as a direct counterpart to the carrier plate 21 of the load port 2. The baseplate 41 has features, described further below, for communication with and adjustment on the carrier plate 21. On the front side, the FOUP 4 has a removable closure plate 42.

Figure 2:
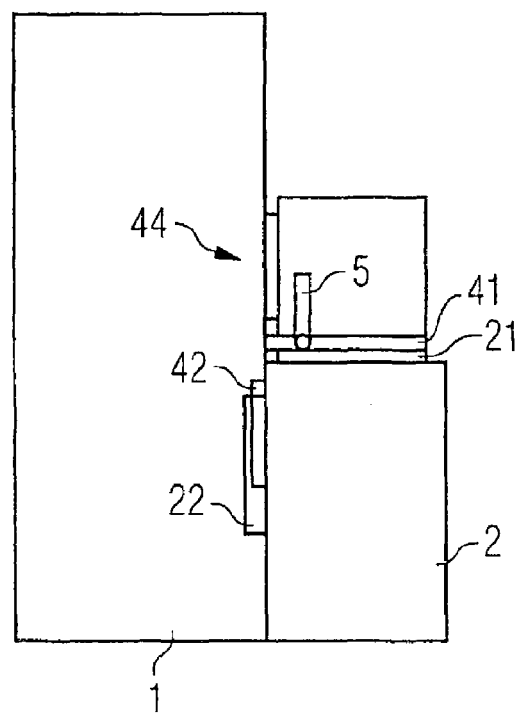
FIG. 2 is an elevational view of the configuration of FIG. 1 with the FOUP connected to the load port.

If, as illustrated in FIG. 2, the FOUP is placed on the carrier plate 21 of the load port, an adjustment is carried out first to ensure that the front side 44 of the FOUP is sealed off adequately with respect to the mini environment by the still closed opening of the load port, so that the mini environment is not contaminated by the ambient air. The door 21 of the load port and the removable cover plate 42 of the FOUP are, then, opened. If the FOUP contains production wafers, the latter can be transferred to the fabrication device 1. In a particularly advantageous application of the invention, the FOUP contains measuring instruments, which examine the air in the mini environment of the fabrication device 1 with regard to one or more contamination parameters.

Figure 7:
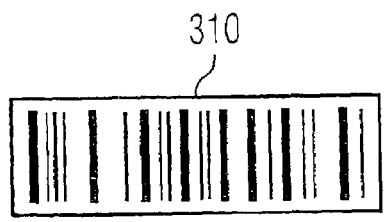
FIG. 7 is a plan view of a bar-code identifier.
Figure 8:
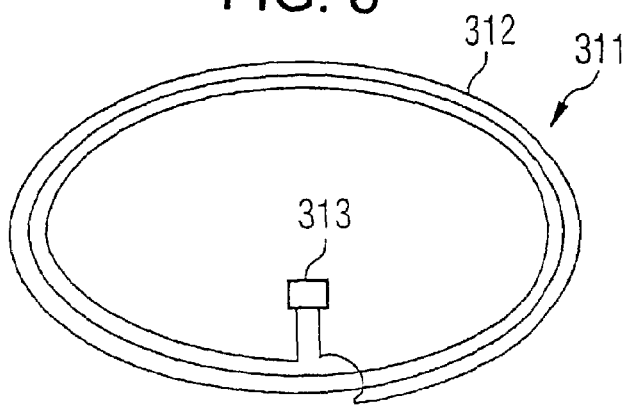
FIG. 8 is a block circuit diagram of an RF tag.

The load port 2 is provided with an identification device or means 3. The identification device 3 is a bar code 310 or an RF tag 311, for example, as illustrated in FIGS. 7 and 8. As an alternative to a bar code 310, two-dimensional codes or any other printed and optically evaluable coding can also be used. The RF tag 311 has an antenna 312 and an integrated semiconductor chip 313, which stores the identification of the load port 2 permanently and digitally and can also store further data values.

The identification device 3 in FIG. 1 has an identification that is assigned individually and uniquely to the load port 2 illustrated within the large number of load ports disposed in the fabrication facility. This identification is stored in the form of the bar code or electronically in the RF tag. For symbolic reasons, the identification device 3 in FIG. 1 is illustrated as a filled sphere. In practice, bar code 310 and RF tag 311 can be obtained as very thin adhesive strips, which are stuck to the carrier plate 21 at the point shown, without adding greatly. The accuracy of positioning the FOUP 4 with respect to the interface elements 21, 22 of the load port 2 is not impaired by the additional identification device.

In the FOUP 4, there is a reader 5, which lies immediately opposite the point at which the identification device 3 is stuck to the load port 2 when the FOUP 4 is placed on the carrier plate 21 of the load port 2, see FIG. 2. The reader 5 can, then, register the bar code by optical measures and determine the digital code.

Figure 3:
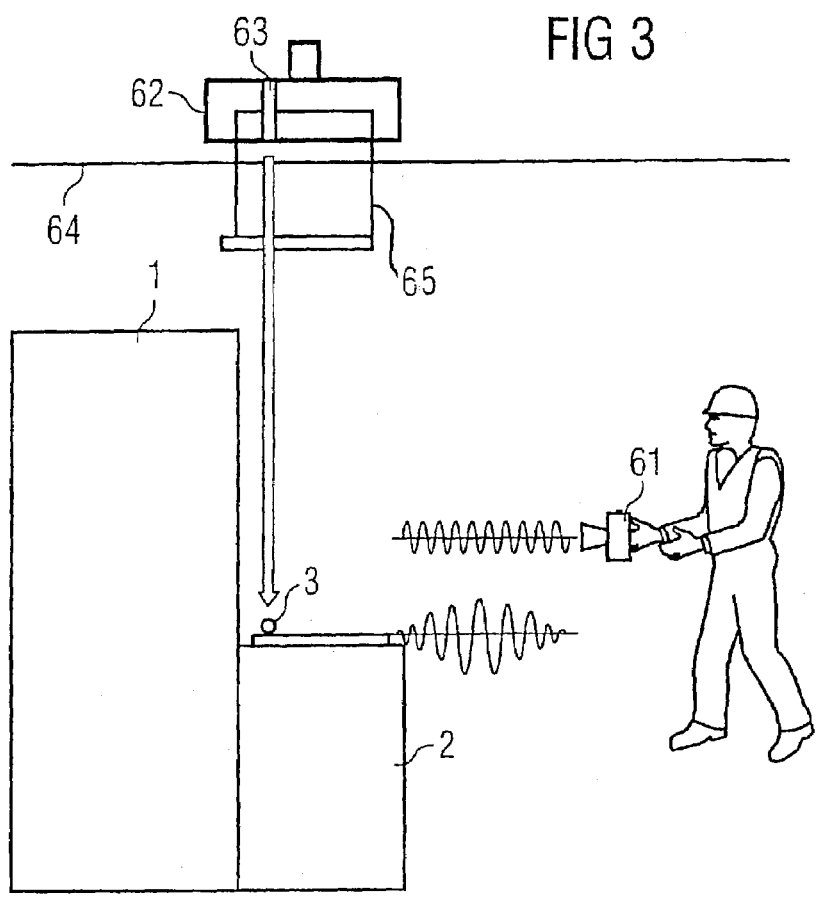
FIG. 3 is an elevational view of a load port according to the invention with a freely movable reader and with a reader fitted to a vehicle of an OHT system.

Shown symbolically in FIG. 3 is an operator, who is bringing a freely movable reader into the detection range of the identifier of the identification device 3. In this case, the identification device 3 is, preferably, configured as an RF tag 311, as illustrated in FIG. 7. The mobile reader 61 can be incorporated in various system components, including an FOUP or a measuring instrument or a position-detecting device. If, for example, the operator carries out an activity at the load port 2, he operates an operating knob on the reader 61 so that the load port identifier is registered. For example, after the load port has been cleaned, the conclusion of the work can be acknowledged by operating a pushbutton on the mobile detection device 61.

In another embodiment, as illustrated in FIG. 3, the reader is disposed on the vehicle 62 of an overhead transport system. The reading device 63 is fixed to the vehicle 62 of the OHT system. The vehicle 62 travels on a rail 64 mounted at overhead height. The reader 63 has sufficient directional characteristics to register the RF tag 3, for example, when an FOUP 65 transported by the vehicle 62 is set down on the load port 2.

Figure 4:
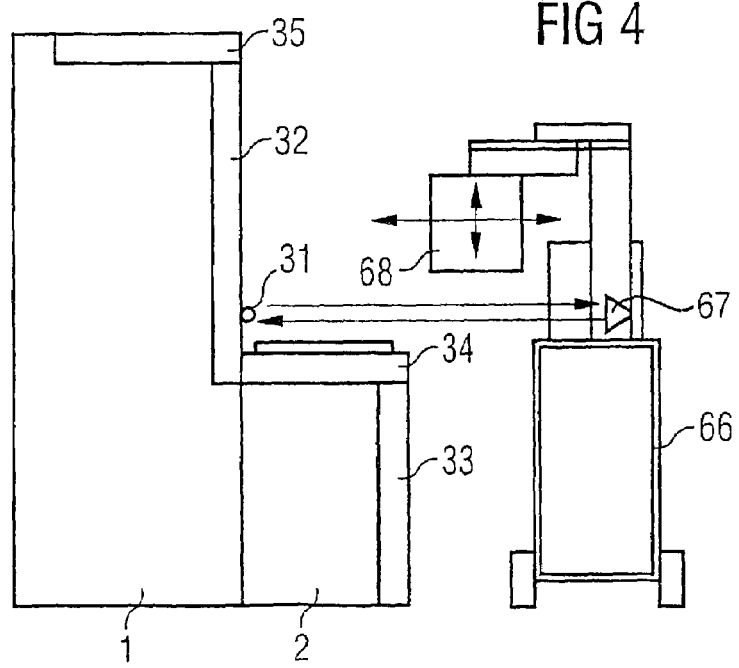
FIG. 4 is an elevational view of the fabrication device according to the invention with a transport device and possible positionings for the identification on the load port.

In FIG. 4, a transport device 66 that can travel on the floor, for example, an automated guided vehicle (AGV), a rail guided vehicle (RGV), or a personal guided vehicle (PGV), is opposite the load port 2. Any other desired mobile robot is also conceivable. The transport device 66 transports a FOUP 68 that is to be set down on the load port 2. The vehicle 66 has a reader 67. In the case of RF detection, the reader has directional characteristics and, in the case of optical detection, zoom optics. At the same height on the load port there is the identifier 31 that, for example, is configured as an RF tag. To document the fact that the FOUP 68 has been set down on the load port 2 by the vehicle 66, the identifier 31 of the load port is read, and the identifier 31 is stored in the controller of the vehicle 66 in association to acknowledge the procedure.

When a vehicle 66 as illustrated in FIG. 4 is used, any part or region 32 or 33 of the front side of the load port is suitable as possible positions for the application of the RF tag or the optical code, for example, in the form of the bar code. The identification device 31 is, preferably, fitted in a region 32, in particular, at eye height, also to make it possible for the operator to read the identification. When the readers are disposed on the vehicles of the OHT system or within an FOUP, the area 34 is suitable. When readers are fitted only to vehicles of the OHT system, the upper horizontal area 35 of the load port or of the fabrication device is suitable. The physical relationship between identification and reader is to be configured such that optical evaluation of the bar code or else electromagnetic interaction with the RF tag is made possible such that it can be assigned unambiguously to the load port and evaluated well.

The FOUP 4 (FIG. 1) can, particularly advantageously, contain a measuring instrument for contamination measurement. The FOUP 4 is placed on the load port 2 during an operating pause of the fabrication device 1. This is done, for example, during the night or during an operating pause as a result of automatic delivery by the OHT system. It is also possible for an operator to place the measuring FOUP on the load port 2 in accordance with a predefined working plan. The measuring FOUP measures contamination parameters of the air in the mini environment 11 of the fabrication device 1. In association with the measurement, the digital identification device 3 of the load port 2 is determined by the reader 5 and stored in the electronics of the measuring FOUP 4 in association with the contamination measured value registered. After the predefined measurement plan has been completed, the measuring FOUP 4 can be connected to a stationary station to read out the automatically registered measured values and the load port identification, registered automatically as described, for further processing.

Figure 6:
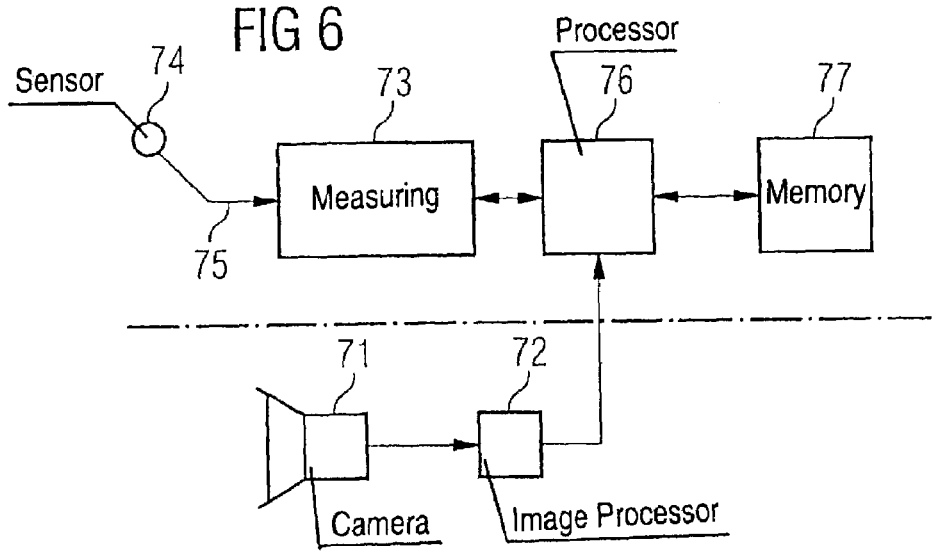
FIG. 6 is a block circuit diagram of a configuration for a measuring FOUP according to the invention.

As illustrated in FIG. 6, the electronics contained in the measuring FOUP contain a CCD camera 71, for example, to register the bar code. An image-processing device 72 determines the digital identifier of the load port from the bar code registered optically. The measuring FOUP also contains measuring electronics 73 with a measuring sensor 74, which can be guided into the mini environment of the fabrication device through a telescopic arm 75. The measuring electronics 73 provide measured values to a central control device, for example, a microprocessor 76. In the processor 76, the measured values are provided with the identifier determined by the image processing device 72 and belonging to the load port at which the measurement was carried out. The association between measured value and load port identification is stored in a memory 77.

Figure 5:
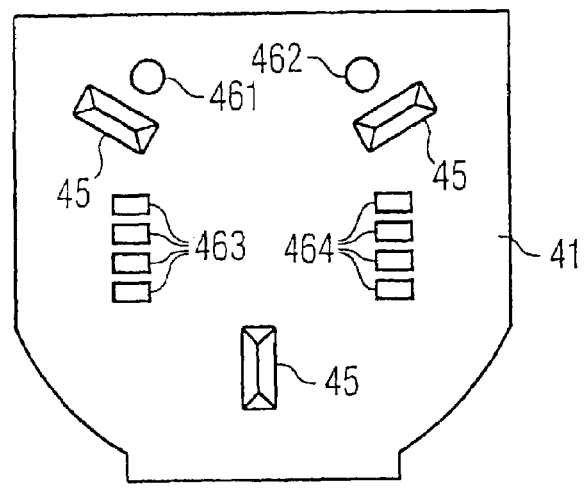
FIG. 5 is a plan view of a baseplate of a FOUP according to the invention with exemplary points for the attachment of an optically readable identification device or a hole to accommodate a camera.

For the case in which the measuring FOUP is used, the baseplate 41 of the measuring FOUP is illustrated separately in detail in FIG. 5. The baseplate 41 has three standardized indentations 45, which have to be brought into coincidence with corresponding adjusting pins 23 on the carrier plate 21 of the load port 2. The carrier plate also has holes 461, 462, one of which is provided to accommodate the image sensor of the CCD camera. The CCD camera and the image processing electronics are disposed within the housing 43 of the FOUP. The housing 43 has an opening that is opposite the holes 461 or 462 and through which the sensor of the CCD camera is guided to be positioned in the corresponding one of the holes 461 or 462. On the load port 2, the bar code is disposed at the appropriate point opposite the hole 461 or 462. For these purposes, on each load port at which the automatic detection of the load port identification is to be carried out, the configuration of the bar code has to be made at the same point. The positions of the holes 461, 462 in the baseplate 41 of the FOUP are defined in accordance with a standard as openings for pressure equalization valves, which form a pressure equalization between the closed interior of the FOUP and the clean-room environment. It is, therefore, possible for the openings in the housing of the FOUP, already present for another reason, and on the baseplate of the FOUP to be used to accommodate the CCD camera.

Alternatively, it is also conceivable to make use of one of the openings designated 463 or 464, first, to position the CCD camera and, second, to apply the bar code exactly opposite on the load port.

When robots or vehicles of the AGV type are used, a vehicle is able to move independently within the semiconductor fabrication plant. This corresponds to the trend toward increasing automation within a fabrication unit or bay. The transport device is able to make decisions independently, regardless of a higher-order control device, depending on the identification determined of an operated load port, or to document operations. This provides a flexible coordinate system whose coordinate locations that can be determined are defined by the locations at which the load port identifiers are applied as optically or electro-magnetically readable markings. The invention can be applied, in particular, within the environment of the fabrication of semiconductor wafers of 300 mm diameter or larger and the automation concepts associated therewith.

We claim:

1. An installation for processing a semiconductor wafer, comprising:
    a device for processing the semiconductor wafer, said device having at least one loading device for supplying the semiconductor wafer;
    said loading device having:
        interface elements for coupling to a container adapted to transport the semiconductor wafer; and
        an identification device storing a constant identity code representing said loading device and being fitted to said loading device; and
    a mobile unit interacting with said identification device, said mobile unit registering said identity code and digitally storing and making available said identity code for further use.

2. The installation according to claim 1, wherein said identification device is applied to said loading device as an optically machine-readable marking.

3. The installation according to claim 1, wherein said identification device is an optically machine-readable marking.

4. The installation according to claim 1, wherein said identification device is applied to said loading device by a marking read through an electromagnetic field.

5. The installation according to claim 1, wherein said identification device is an electromagnetic field readable marking.

6. The installation according to claim 1, further comprising:
    a transport device adapted to transport the container to said loading device; and
    a reader fixed to said transport device and detecting said identity code.

7. The installation according to claim 6, wherein:
    said transport device is a rail-guided transport system having rails and vehicles guided by said rails for transporting the container; and
    said reader is fixed to at least one of said vehicles.

8. The installation according to claim 6, wherein:
    said transport device is a vehicle for transporting the container by moving on a floor; and
    said reader is fixed to the vehicle.

9. An installation for processing a semiconductor wafer, comprising:
    a device for processing the semiconductor wafer, said device having at least one loading device for supplying the semiconductor wafer;
    said loading device having:
        interface elements for coupling to a container adapted to transport the semiconductor wafer; and
        an identification device storing an identity code representing said loading device and being fitted to said loading device; and
    a mobile unit interacting with said identification device, said mobile unit registering said identity code and digitally storing and making available said identity code for further use;
    a further container removably coupled to said loading device through said interface elements, said further container having a signal processing device producing an output value; and
    a reader fixed at said further container, said reader assigning said output value said identity code digitally provided by said loading device.

10. The installation according to claim 9, wherein said identification device is applied to a section of said loading device disposed opposite one side of said further container placed on said loading device.

11. The installation according to claim 10, wherein:
    said interface elements have a carrier plate receiving thereon said further container communicating with said loading device; and
    said identification device is fixed to said carrier plate.

12. The installation according to claim 9, wherein:
said identification device is an optical identification device; and
said further container has an image recording device recording said identity code from said loading device on which at least one of the container and said further container is placed.

13. The installation according to claim 12, wherein:
said image recording device has an optical sensor disposed within at least one of the container and said further container;
said interface elements have a carrier plate receiving thereon said further container communicating with said loading device; and
said optical sensor lies immediately opposite said identification device when at least one of the container and said further container is placed on said carrier plate.

14. The installation according to claim 13, wherein at least one of the container and said further container has:
a baseplate with a hole accommodating said optical sensor; and
an image evaluation device determining said identity code from an optically received signal.

15. The installation according to claim 9, wherein:
said further container has a measuring device for measuring contamination of the air; and
said reader determines said identity code associated with a contamination measuring operation and associated with a contamination value and stores said identity code temporarily in said signal processing device.

* * * * *